(12) United States Patent
Zieba et al.

(10) Patent No.: US 10,557,972 B2
(45) Date of Patent: Feb. 11, 2020

(54) LAMELLAR PARTICLES HAVING DIFFERENT PROPERTIES IN DIFFERENT AREAS AND METHODS OF MANUFACTURE

(71) Applicant: VIAVI SOLUTIONS INC., San Jose, CA (US)

(72) Inventors: Jaroslaw Zieba, Santa Rosa, CA (US); Kelly Janssen, Santa Rosa, CA (US)

(73) Assignee: VIAVI SOLUTIONS INC., San Jose, CA (US)

( * ) Notice: Subject to any disclaimer, the term of this patent is extended or adjusted under 35 U.S.C. 154(b) by 60 days.

(21) Appl. No.: 15/908,320

(22) Filed: Feb. 28, 2018

(65) Prior Publication Data

US 2018/0252847 A1  Sep. 6, 2018

Related U.S. Application Data

(60) Provisional application No. 62/465,605, filed on Mar. 1, 2017.

(51) Int. Cl.
| | |
|---|---|
| *B32B 5/16* | (2006.01) |
| *G02B 5/00* | (2006.01) |
| *B32B 15/00* | (2006.01) |
| *G02B 1/11* | (2015.01) |
| *C09C 1/00* | (2006.01) |

(Continued)

(52) U.S. Cl.
CPC .............. *G02B 5/003* (2013.01); *B32B 15/00* (2013.01); *C09C 1/0021* (2013.01); *C09K 5/14* (2013.01); *G02B 1/11* (2013.01); *H05K 9/0092* (2013.01); *B32B 2307/212* (2013.01); *B32B 2307/71* (2013.01); *C01P 2004/80* (2013.01); *C01P 2006/32* (2013.01); *C01P 2006/40* (2013.01); *C01P 2006/42* (2013.01); *C01P 2006/62* (2013.01); *C09C 2200/1054* (2013.01); *C09C 2200/401* (2013.01); *C09C 2200/403* (2013.01); *C09C 2200/405* (2013.01); *C09C 2200/407* (2013.01); *C09C 2220/106* (2013.01)

(58) Field of Classification Search
CPC ........ B22F 1/0055; B22F 1/0007; B22F 1/02; C09C 1/0015
USPC ........................................................ 428/403
See application file for complete search history.

(56) References Cited

U.S. PATENT DOCUMENTS

| | | |
|---|---|---|
| 2002/0134282 A1 | 9/2002 | Ostertag et al. |
| 2002/0160194 A1 | 10/2002 | Phillips et al. |

(Continued)

FOREIGN PATENT DOCUMENTS

| | | |
|---|---|---|
| DE | 102011012214 A1 | 8/2012 |
| EP | 747453 A2 | 12/1996 |
| WO | 2015/044188 A1 | 4/2015 |

OTHER PUBLICATIONS

Cabot et al, Vacancy Coalescence during Oxidation of Iron Nanoparticles, J. Am. Chem. Soc. 2007, 129, 10358-10360 (Year: 2007).*

*Primary Examiner* — Hoa (Holly) Le
(74) *Attorney, Agent, or Firm* — Mannava & Kang, P.C.

(57) ABSTRACT

There is disclosed a lamellar particle including an unconverted portion of the lamellar particle, wherein the unconverted portion includes a first metal, a converted portion of the lamellar particle disposed radially outward of at least one of a surface of the unconverted portion, wherein the converted portion includes a chemical compound of the first metal.

20 Claims, 12 Drawing Sheets

(51) Int. Cl.
*C09K 5/14* (2006.01)
*H05K 9/00* (2006.01)

(56) References Cited

U.S. PATENT DOCUMENTS

2004/0001299 A1\* 1/2004 van Haaster ......... G02B 6/4277
 361/118
2013/0058988 A1 3/2013 Winkelmann et al.

\* cited by examiner

US 10,557,972 B2

LAMELLAR PARTICLES HAVING DIFFERENT PROPERTIES IN DIFFERENT AREAS AND METHODS OF MANUFACTURE

RELATED APPLICATION

This application claims priority to U.S. Provisional Application No. 62/465,605, filed Mar. 1, 2017, the disclosure of which is hereby incorporated by reference in its entirety.

TECHNICAL FIELD

Lamellar particles with certain properties and methods of manufacture for making lamellar particles with certain properties.

BACKGROUND

Current methods of producing pigments are expensive, require large capital investments, and/or yield pigment that requires additional passivation and/or compatibilization processes. Thus, there exists a need for a lower cost method of manufacturing pigments that does not require additional passivation and compatibilization processes.

SUMMARY

Aspects of the present disclosure relate to, among other things, a lamellar particle including an unconverted portion of the lamellar particle, wherein the unconverted portion includes a first metal, a converted portion of the lamellar particle disposed radially outward of at least one of a surface of the unconverted portion, wherein the converted portion includes a chemical compound of the first metal.

It can be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate exemplary embodiments of the present disclosure and together with the description, serve to explain the principles of the disclosure.

Throughout this specification and figures like reference numbers identify like elements.

DETAILED DESCRIPTION

Figure 1:
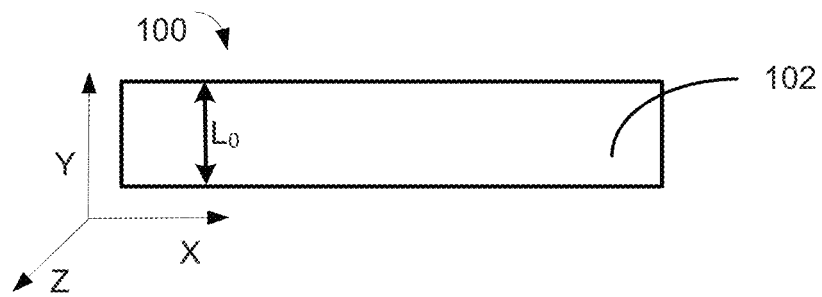
FIG. 1 is a pre-conversion lamellar particle according to an aspect of the disclosure.

Reference is now made in detail to examples of the present disclosure, examples of which are illustrated in the accompanying drawings. Wherever possible, the same reference numbers will be used throughout the drawings to refer to the same or like parts. As used herein, the terms "approximately" and "substantially" indicate a range of values within +/−5% of a stated value.

Aspects of the present disclosure relate to lamellar particles and systems and methods for creating lamellar particles with certain properties by manipulating these properties (including visual and non-visual attributes) through chemical conversion. The devices and methods herein allow for cost-competitive manufacturing of high quantities of metallic pigment. These devices and methods also establish manufacturing scale capability without excessive capital investment. Further, the resulting particles yield pigment that does not require additional passivation and compatibilization processes. The pigment can be manufactured by a process of metal chemical conversion (MCC). Based on the selection of materials and structures incorporated into these MCC pigments, the methods described herein offer pigments with a combination of specific visual and non-visual attributes.

According to the present disclosure, a particle including, but not limited to a lamellar particle, e.g., pre-conversion lamellar particles 100, 200, 300, 400, and/or 500 of FIGS. 1, 5, 9, 13, and 15, can be converted to a lamellar particle with desired properties (e.g., optical, physical, and/or chemical properties) different than the properties of the pre-conversion lamellar particle.

For example, the converted lamellar particle of the present disclosure can result in specific, desired, and/or enhanced optical properties, such as specific and/or desired wavelengths and/or levels of absorption and/or reflectance. In particular, the converted lamellar particle of the present disclosure can have non-selective absorption of light at certain wavelengths ranging from about 380 nm to about 760 nm at a level of 90% and greater of the incident light to make the converted lamellar particle appear black, non-selective reflectance of incident light at the level of 10% or greater to make the converted lamellar particle appear gray, non-selective reflectance of incident light at wavelengths ranging from about 380 nm to about 760 nm at the level of 80% and greater to make the converted lamellar particle appear white, selective light reflectance in the visible range of the spectrum to provide visual color (e.g., capable of being viewed by the human eye), selective light reflectance in the visible range of the spectrum at reflectance levels that are required to provide visual color combined with metallic reflectance of the metal core, and/or selective reflectance of electromagnetic radiation in the infrared part of the spectrum ranging from about 0.85 to about 20 microns combined with one or more of the desired optical properties in the visible range of the spectrum as listed above.

Further, the converted lamellar particles of the present disclosure can additionally or alternatively result in specific, desired, and/or enhanced non-optical properties, such as corrosion resistance, heat conductivity (e.g., higher than 1.5 W/mK), electrical conductivity (e.g., higher than $10^{-5}$ S/m), ferromagnetic properties (e.g., if pre-conversion lamellar particles 100, 200, 300, 400, and/or 500 of FIGS. 1, 5, 9, 13, and 15 include ferromagnetic properties), and/or hydrophobic properties (e.g., when conversion chemicals contain functional groups yielding low surface energy). Further, the converted lamellar particles of the present disclosure can have heat-rejecting properties and/or infra-red wavelengths reflecting functions offering an alternative way of managing energy preservation. Additionally or alternatively, the converted lamellar particle can provide leafing and/or color flopping options, black colors combined with different color hues appearing at various viewing angles, shielding electromagnetic radiation, a flake format with a large range of thicknesses, linear dimensions, and/or aspect ratios driven by their end application, both metallic and flat color versions of the converted lamellar particle, heat-reflecting properties, metallic pigments with enhanced environmental stability (stable against heat, water, oxygen, chemical, and/or UV exposure), and/or pigments compatible with various chemical media, such as paints, inks, rubbers, polymers including textiles materials, ceramic materials including construction materials such as cement and concrete.

A plurality of the converted lamellar particles described herein can be combined to create pigment, including, but not limited to a metallic effect pigment, a magnetic pigment, an EMI attenuating pigment, an electrically conductive pigment, a heat conducting pigment, or a pigment with a combination of any or all of the preceding properties.

The lamellar particles of the present disclosure (e.g., pre-conversion lamellar particles 100, 200, 300, 400, and/or 500) can be non-naturally occurring. In some examples, the lamellar particles (e.g., pre-conversion lamellar particles 100, 200, 300, 400, and/or 500) can be formed by, for example, sol-gel, chemical bath deposition, plating, physical vapor deposition, and chemical vapor deposition.

The lamellar particles (e.g., pre-conversion lamellar particles 100, 200, 300, 400, and/or 500) described herein can be any shape. Lamellar particles (e.g., pre-conversion lamellar particles 100, 200, 300, 400, and/or 500) can include a first side substantially flat and/or straight in a first direction (e.g., the x-direction of FIG. 1). As illustrated herein, the lamellar particles (e.g., pre-conversion lamellar particles 100, 200, 300, 400, and/or 500) can include a second side that is substantially flat and/or straight in a second direction (e.g., the y-direction of FIG. 1) and/or substantially perpendicular to the first side. In another aspect, the second side can instead be round, pointed, wavy, etc. Further, the second side is not substantially perpendicular to the first side. The lamellar particles (e.g., pre-conversion lamellar particles 100, 200, 300, 400, and/or 500) can include a third side in a third direction (e.g., the z-direction of FIG. 1). The third side can have any shape, including, but not limited to, round, rectangular, and/or irregular. In further examples, the lamellar particles (e.g., pre-conversion lamellar particles 100, 200, 300, 400, and/or 500) can be described as flat, flat with an irregularly-shaped third side (e.g., corn-flake shaped), flat with a round third side, and/or flat with a rectangular third side. In some examples, the pre-conversion lamellar particles 100, 200, 300, 400, and/or 500 may be a sheet and/or foil.

The lamellar particles (e.g., pre-conversion lamellar particles 100, 200, 300, 400, and/or 500) described herein can be any size. For example, pre-conversion lamellar particles 100, 200, 300, 400, and/or 500 can have any width (e.g., the x-direction of FIG. 1) including, but not limited to, a width of approximately 2 microns to approximately 200 microns, approximately 4 microns to approximately 100 microns, or approximately 10 microns to approximately 50 microns. Pre-conversion lamellar particles 100, 200, 300, 400, and/or 500 can have any physical thickness (e.g., the y-direction of FIG. 1) including, but not limited to, a physical thickness of approximately 0.1 microns to approximately 2 microns, approximately 0.5 microns to approximately 1.5 microns, or approximately 1 micron. Further, pre-conversion lamellar particles 100, 200, 300, 400, and/or 500 can have any aspect ratio (e.g., the ratio between the width of the pre-conversion lamellar particle and the physical thickness of the pre-conversion lamellar particle) including, but not limited to, an aspect ratio of approximately 5:1 or greater, approximately 5:1 to approximately 500:1, for example from approximately 10:1 to approximately 250:1, or approximately 100:1.

As illustrated in FIGS. 1-16B, certain properties or attributes of an unconverted portion of pre-conversion lamellar particles 100, 200, 300, 400, and/or 500, respectively, can change when subjected to a conversion process. In an aspect, at least a part of the unconverted portion can include a material that can, at least partially, be converted from having a first property to having a second property. For example, at least a part of the unconverted portion, if subjected to a conversion process, can, at least partially, be converted to change any property, including but not limited to an optical, physical, and/or chemical property. In an aspect, at least a part of the unconverted portion can include a material including, but not limited to, aluminum, copper, stainless steel, silver, gold, zinc, iron, bronzes, manganese, titanium, zirconium, vanadium, niobium, chromium, molybdenum, nickel, tungsten, tin, indium, bismuth, alloys of any of these metals, or a combination thereof. In an aspect, a lamellar particle can include an unconverted portion 180, 280, 380, 480, and 580 of the lamellar particle, wherein the unconverted portion 180, 280, 380, 480, and 580 includes a first metal.

The conversion process can be any process that converts a first property of at least a part of the unconverted portion

180, 280, 380, 480 and 580, to a second property. Various conversion chemistries can be used to control color, chromaticity, gloss, leafing, durability, heat or electrical conductivity, and other properties of the resulting particles (e.g., converted lamellar particles 150, 250, 350, 450, and/or 550). For example, the conversion process can convert at least a part of the unconverted portion 180, 280, 380, 480 and 580 from a first color to a second color and/or convert at least a part of the unconverted portion 180, 280, 380, 480 and 580 from a first level of heat conductivity to a second level.

The conversion process can include subjecting a pre-conversion lamellar particle to a reactant. The reactant can be in any state, such as plasma state, gas state, solid state, or liquid state or a combination thereof. The reactant can include any chemical or physical factors that can cause a reaction with at least a part of the unconverted portion 180, 280, 380, 480 and 580 of the pre-conversion lamellar particle and convert, in a controllable manner, at least a part of the unconverted portion to a converted portion 170, 270, 370, 470, and 570.

In one example, a water and solvent-borne environment can be used as the reactant. In some examples, the conversion process can include the use of various types of chemical reactants, including batch and continuous stirred tank reactants, tubular reactants, tumbling bed reactants, fluidized bed reactants, continuous flow tube and batch furnaces. In such examples, pre-conversion lamellar particles 100, 200, 300, 400, or 500 can be subjected to chemical(s) that cause at least partial conversion of pre-conversion lamellar particles 100, 200, 300, 400, 500 or at least a part of the unconverted portion 180, 280, 380, 480 and 580.

The chemical bath composition used herein can include an inorganic compound or an organic compound. An example of an inorganic compound can include at least one of sulfur, sulfides, sulfates, oxides, hydroxides, isocyanates, thiocyanates, molybdates, chromates, permanganates, carbonates, thiosulfates, colloidal metals, inorganic salts, and mixtures thereof. An example of an organic compound can include an organic compound that contains sulfur, such as thiols, thioamine, oxythio amines, thiourea, thiocyanates; nitrogen, such as amines, and isocyanates; oxygen; silicon, such as silanes; or a combination thereof. Further, the chemical bath can include at least one of inorganic or organic salts of metals or metallic organic compounds of metals. In yet another aspect, the chemical bath can include an oxidizing agent, a surface modifier, and/or an inhibitor.

In an aspect, the unconverted portion 180, 280, 380, 480, and 580 of a converted lamellar particle 150, 250, 350, 450, and 550 can provide a light reflectance in a spectral region ranging from 0.4 to 20 microns and the converted portion 170, 270, 370, 470, and 570 can absorb light in a selected region of this spectral range. In some examples, the selected regions can be in the visible range. In an aspect, the unconverted portion 180, 280, 380, 480, and 580 of a converted lamellar particle can provide infrared reflectance.

The converted portion 170, 270, 370, 470, and 570 can absorb light in a selected region capable of being viewed by the human eye. The converted portion can modulate light in the visible range to create a desired color. For example, converted portion 170, 270, 370, 470, and 570 can appear red to the human eye (e.g., approximately 380 nm to approximately 600 nm), black to the human eye (e.g., absorbing approximately 380 nm to approximately 760 nm), or white. Further, for example, converted portion 170, 270, 370, 470, and 570 can appear blue to the human eye (e.g., absorbing approximately 500 nm to approximately 760 nm), or can appear green to the human eye (e.g., absorbing approximately 380 nm to approximately 500 nm and also absorbing approximately 600 nm to approximately 760 nm).

The converted portion 170, 270, 370, 470, and 570 can absorb light in a selected near-infrared region of the spectrum capable of being detected by electronic sensors. The converted portion can modulate light in the near-infrared range to provide a selected level of absorption. For example, converted portion 170, 270, 370, 470, and 570 can absorb light from approximately 720 nm to approximately 1100 nm, or can absorb light from approximately 950 nm to approximately 1700 nm.

In some examples, the unconverted external layer and/or the unconverted inner core of the pre-conversion lamellar particles can include additives (e.g., dyes) for selectively absorbing or reflecting energy. In some examples, the unconverted external layer and/or unconverted inner core of the pre-conversion lamellar particles do not include additives (e.g., dyes) for selectively absorbing or reflecting energy.

After the conversion process, the converted portion of a converted lamellar particle can have any thickness, including, but not limited to approximately 0.01 microns to approximately 0.9 microns, approximately 0.1 microns to approximately 0.8 microns, or approximately 0.5 microns. The total size of the converted lamellar particle and/or thickness of the converted portion of the converted lamellar particle can depend on a variety of factors including, but not limited to, the extent to which a reaction, such as a chemical reaction, converts the pre-conversion lamellar particle. The different optical and non-optical properties can be achieved by adjusting varying aspects of the pre-conversion lamellar particle and the conversion process. For example, the converted lamellar particle can have different optical and/or non-optical properties based on the material, structure, size, shape, and/or aspect ratio of the pre-conversion lamellar particle, type of applied chemical treatment, and process conditions, such as concentrations of reactive ingredients, applied additives, pH, temperature, type of agitation, and length of exposure. In some examples, the converted lamellar particle can have at least one different non-optical property than the pre-conversion lamellar particle. In one example, the converted lamellar particle can have a different electrical conductivity and/or thermal conductivity than the pre-conversion lamellar particle. The measured sheet resistance can be 100 Ohms or less and/or the thermal conductivity would be 3 $W*m^{-1} K^{-1}$ or higher. The resistance and the thermal conductivity of the converted lamellar particle can depend on the metal used in the conversion process.

The amount of lamellar particle and/or the specific layers (inner core, internal layer, and/or external layer, etc.) that are converted can depend on a variety of factors, including but not limited, the composition of the chemical conversion process (e.g., the composition of the chemical bath), its concentration, the time of exposure to the conversion process, the temperature during the conversion process, and/or the structure of the pre-conversion lamellar particle (e.g., the inclusion of a corrosion barrier, an internal layer, and/or barrier layer). In addition, the reactant used in the chemical conversion process can include self-inhibiting properties after converting to a certain depth into the pre-conversion lamellar particle. For example, 0.5 percent of the pre-conversion lamellar particle can be converted or 100 percent can be converted, including all the ranges of percent conversion in between.

Subjecting the pre-conversion lamellar particle to a chemical conversion process can convert the pre-conversion lamellar particle to a converted lamellar particle (e.g., converted lamellar particles 150, 250, 350, 450, and/or 550) by converting a least a part of the pre-conversion lamellar particle. For example, 0.5 percent of the pre-conversion lamellar particle can be converted or 100 percent can be converted, including all the ranges of percent conversion in between. In an aspect, at least a part of the lamellar particle is converted (e.g., converted portions of lamellar particle 170, 270, 370, 470, and 570), while another part remains unconverted (e.g., unconverted portions of the lamellar particle 180, 280, 380, 480, and 580). In other examples, the entire lamellar particle is converted. In such examples, a converted lamellar particle would no longer include a material, such as metal, but would instead include a chemical compound of the material, such as a chemical compound of the metal.

The converted portions of lamellar particle 170, 270, 370, 470, and 570 can include at least a chemical compound of a material, such as a first metal, included in the unconverted portion 180, 280, 380, 480, and 580 of the pre-conversion lamellar particle. For example, if the unconverted external layer 102, 202, 302, 402, and 502 of the pre-conversion lamellar particle 100, 200, 300, 400, 500 included copper and the pre-conversion lamellar particle was subjected to sulfur during a conversion process, the converted portion 170, 270, 370, 470, 570 of the converted lamellar particle 150, 250, 350, 450, 550 could include a chemical compound of copper, i.e., copper sulfide, and the unconverted portion 180, 280, 380, 480, 580 of the converted lamellar particle could include copper. In some examples, a pre-conversion lamellar particle can be completely converted or completely unconverted, including all ranges of percent conversion in between.

Figure 5:
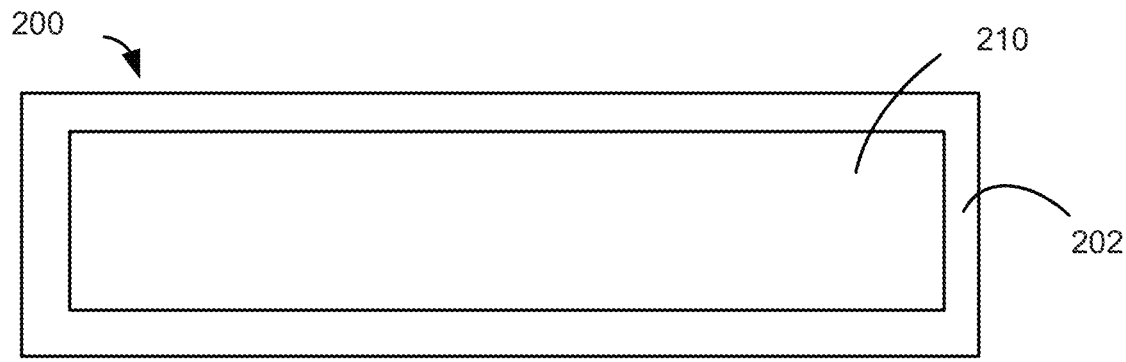
FIG. 5 is a pre-conversion lamellar particle according to another aspect of the disclosure.

In an aspect, if a pre-conversion lamellar particle has an inner core and an external layer, such as shown in FIG. 5, then each of the inner core and the external layer can be completely converted or completely unconverted, including all ranges of percent of conversion in between. For example, the converted portion 170, 270, 370, 470, and 570 of the converted lamellar particle 150, 250, 350, 450, and 550 can include (i) converted external layer 204, 304, 404, and 504; and/or (ii) the converted external layer 204, 304, 404, and 504 and the converted inner core 206, 306, 406, and 506. The unconverted portion 180, 280, 380, 480, and 580 of the converted lamellar particle 150, 250, 350, 450, and 550 can include (i) the unconverted inner core 210, 310, 410, and 510; and/or (ii) the unconverted external layer 202, 302, 402, and 502 and the unconverted inner core 210, 310, 410, and 510. In an aspect, in some examples, the entire unconverted external layer 102, 202, 302, 402, and 502 is converted. In some examples, the entire unconverted external layer 102, 202, 302, 402, and 502 is converted, as well as at least a part of the unconverted inner core 210, 310, 410, 510. In some examples, the unconverted portions of the lamellar particle 180, 280, 380, 480, and 580 can include a plurality of layers, such as an internal layer 420, 520 and/or a plurality of materials.

In some examples, the plurality of layers can include at least two different materials, such as two different metals. Some or all of the different materials can be a metal. In an aspect, each layer of the plurality of layers can be made of a different material than each other layer of the plurality of layers.

In an aspect, the converted portion 170, 270, 370, 470, and 570 of the lamellar particle can be external to a surface of the unconverted portion 180, 280, 380, 480 and 580, which can include an unconverted external layer 202, 302, 402, and 502, an internal layer 420, 520, and/or an unconverted inner core 110, 210, 310, 410, and 510.

Any of the lamellar particles described herein or created by processes described herein can be used in a variety of applications. For example, among other applications, the converted lamellar particles can be used for camouflage, sensing, charge dissipation, dissipating heat, shielding against electromagnetic interferences, and decorations. More specifically, the converted lamellar particles and/or the conversion process can be used in textiles. The converted lamellar particles can be used for pigmentation of textiles and/or adding additional non-visual attributes to fabrics. For example, the converted lamellar particles can be used to create heat-rejecting fabrics, infrared-rejecting fabrics, electromagnetic radiation shielding fabrics, heat conducting fabrics, electrically-conductive yarns and fabrics, yarns and fabrics with ferromagnetic properties, camouflage, and/or radiation (e.g., infrared, heat, electromagnetic) shielding properties. In some examples, converted lamellar particles used for textiles may be smaller than those used for other applications (e.g., automotive and architectural). For example, converted lamellar particles used in textile application can be approximately 2 microns, or smaller than approximately 10 microns. Converted lamellar particles used in automotive can be approximately 8 microns to approximately 200 microns and converted lamellar particles used in architectural applications can be up to approximately 200 microns.

The converted lamellar particles and/or the conversion processes can also be used as pigments for specialty paints, inks, varnishes, and coatings that can provide coloration together with non-visual attributes. For example, converted lamellar particles and/or the conversion processes can be used in pigments for metallic inks, heat and IR rejection, electromagnetic radiation shielding, heat conductivity, electrical conductivity, and/or ferromagnetic properties The converted lamellar particles and/or the conversion processes can also be used in construction and architectural materials. For example, the converted lamellar particles can be used in heat-rejecting paints for architectural applications, heat-rejecting roofing, siding, and decking materials, heat-rejecting cement and concrete, electromagnetic shielding paints for architectural and construction applications, and/or static charge controlling paints The converted lamellar particles and/or the conversion processes can be used in various automotive applications, including, but not limited LIDAR, heat-reflecting exterior automotive pigments and coatings, black single component pigments with various color hue flop, semi-metallic pigments with unique color hues, and/or heat and/or static charge dissipating pigments for automotive interior applications.

The converted lamellar particles and/or the conversion processes can be used in various applications in cosmetics and healthcare, for example, direct skin-on application of pigments for esthetic, protective, diagnostic, and/or medical treatments.

The converted lamellar particles and/or the conversion processes can be used in various other applications, including, but not limited to, RF antennas, magnetic taggants, special effect pigments, and pigments for electroluminescent inks and coatings.

The pre-conversion lamellar particles of the present disclosure can have any layer structure. Pre-conversion lamellar particles 100, 200, 300, 400, and 500 are merely exemplary. The pre-conversion lamellar particles can include any number of layers, such as a plurality of layers. These layer(s)

can be made of any material, such as a first metal, in any configuration, and/or in any order. In an aspect, the pre-conversion lamellar particles 100, 200, 300, 400, and 500 can include an unconverted inner core 210, 310, 410, and 510 and an unconverted external layer 202, 302, 402, and 502. In another aspect, the pre-conversion lamellar particles 100, 200, 300, 400, and 500 can include additional layers, such as an internal layer 420, 520, between the unconverted inner core 210, 310, 410, and 510 and the unconverted external layer 202, 302, 402, and 502. Further, unconverted inner core 210, 310, 410, and/or 510 can include a plurality of layers.

Figure 2:
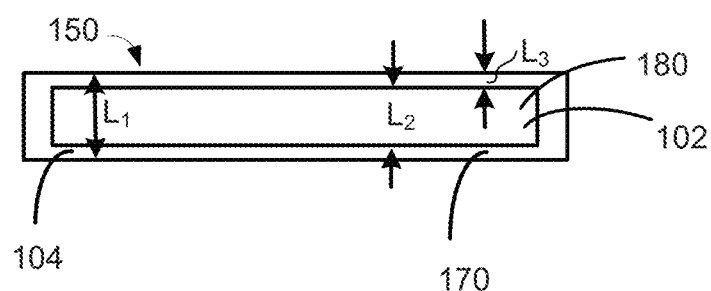
FIG. 2 is a converted lamellar particle according to an aspect of the disclosure.

In one example, as illustrated in FIG. 1, the pre-conversion lamellar particle 100 can be a monolithic particle composed of a single material (e.g., a single metal, such as a first metal). Pre-conversion lamellar particle 100 consists of one layer; unconverted external layer 102. Once subjected to a conversion process (including, but not limited to, those described above), pre-conversion lamellar particle 100 can be converted to a converted lamellar particle, including, but not limited to, converted lamellar particle 150 of FIG. 2, 3, or 4. Converted lamellar particle 150 can include a converted portion 170 and an unconverted portion 180. The unconverted portion 180 can include a first metal and the converted portion 170 can include a chemical compound of the first metal. In this example, because the pre-conversion lamellar particle 100 consists of unconverted external layer 102, the converted portion of the external layer 104 is the same as the converted portion of the lamellar particle 170, as shown in FIG. 2. Additionally, the unconverted portion of the external layer 102 is the same as the unconverted portion of the lamellar particle 180.

The physical thickness $L_1$ of converted lamellar particle 150 can be about the same physical thickness $L_0$ of the pre-conversion lamellar particle 100. Thus, the physical thickness $L_1$ can be approximately 0.1 microns to approximately 2 microns, approximately 0.5 microns to approximately 1.5 microns, or approximately 1 micron. In some examples, however, thickness $L_1$ of converted lamellar particle 150 can be greater than the physical thickness $L_0$ of the pre-conversion lamellar particle 100. For example, the conversion process can cause, at least a portion of the pre-conversion lamellar particle 100 to expand. As shown in FIG. 2, $L_1$ is the sum of the thickness $L_2$ of the unconverted portion 102/180 and the two thicknesses $L_3$ of the converted portion 104/170 on either side of unconverted portion 102/180.

Figure 3:
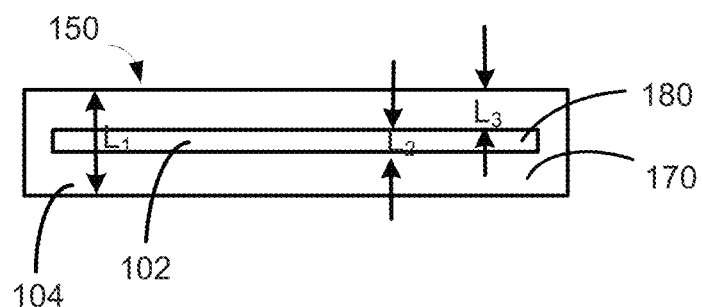
FIG. 3 is a converted lamellar particle according to another aspect of the disclosure.
Figure 4:
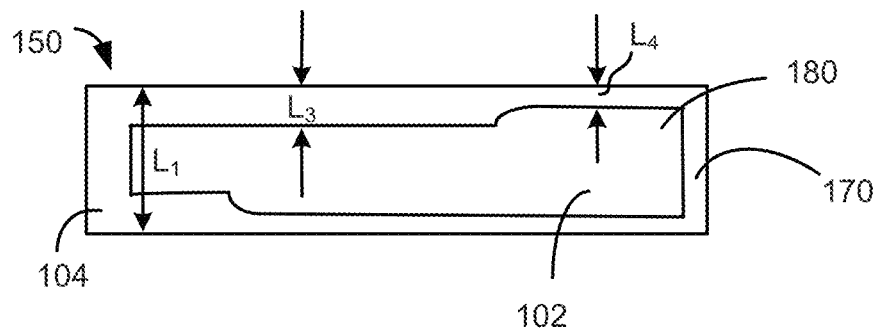
FIG. 4 is a converted lamellar particle according to another aspect of the disclosure.

In an aspect, the thickness $L_3$ of the converted portion 104/170 can range from about one percent to about 100 percent of the total thickness $L_1$ of the converted lamellar particle 150. In an example, as shown in FIG. 2, the unconverted portion 102/180 can have a physical thickness $L_2$ which is greater than the physical thickness $L_3$ of the converted portion 104/170. In another example, as shown in FIG. 3, the unconverted portion 102/180 can have a physical thickness $L_2$ which is less than the thickness $L_3$ of the converted portion 104/170. In yet another example, as shown in FIG. 4, the unconverted portion 102/180 and the converted portion 104/170 can have variable physical thicknesses. In this example, the converted portion 104/170 can include a first thickness $L_3$ and a second thickness $L_4$. The physical thickness of the unconverted portion 102/180 can vary in accordance with the physical thickness of the converted portion 104/170.

In another example, as illustrated in FIG. 5, the pre-conversion lamellar particle 200 can include an unconverted external layer 202 external to at least three sides of an unconverted inner core 210). In some examples, the unconverted external layer 202 can be external to at least four sides, at least five sides, or at least six sides of the unconverted inner core 210. The unconverted external layer 202 can completely encapsulate the unconverted inner core 210. The unconverted inner core 210 can be made of a first material and the unconverted external layer 202 can be made of a second material different than the first material. In some examples, the first material can be a first metal and the second material can be a second metal. In some examples, the first material can include, but is not limited to, aluminum, copper, stainless steel, silver, gold, zinc, iron, bronzes, manganese, titanium, zirconium, vanadium, niobium, chromium, molybdenum, nickel, tungsten, tin, indium, bismuth, alloys of any of these metals or a combination thereof. The second material can include, but is not limited to (i) metals or metal alloys, such as one or more of aluminum, copper, silver, gold, zinc, iron, bronzes, manganese, titanium, zirconium, vanadium, niobium, chromium, molybdenum, nickel, tungsten, tin, indium, bismuth, alloys of any of these metals or a combination thereof, (ii) dielectrics, such as metal oxides, glasses, chalcogenides, halides, sulfides, minerals, synthetic micro and nano-crystals, organic and inorganic polymers, (iii) conductive materials, such as indium-tin oxide, tin oxide, metal doped oxides, and conductive polymers, and/or (iv) metalloids and non-metals, such as silicon, germanium, carbon, graphite, and graphene. The materials listed in (ii)-(iv) can be partially and/or not completely converted when subjected to chemical conversion. The materials listed in (ii)-(iv) can provide various non-visual attributes or can act as a conversion barrier. For example, the first material can be less reactive to a given conversion process, thus creating a location within the lamellar particle in which the conversion is likely to stop, i.e., functioning as a "conversion barrier." Further, in some examples, the unconverted inner core 210 and/or the unconverted external layer 202 can include a plurality of layers, such as an internal layer, and/or a plurality of materials. In some examples, each layer of the plurality of layers can include the same materials or each layer of the plurality of layers can include different materials.

Figure 6:
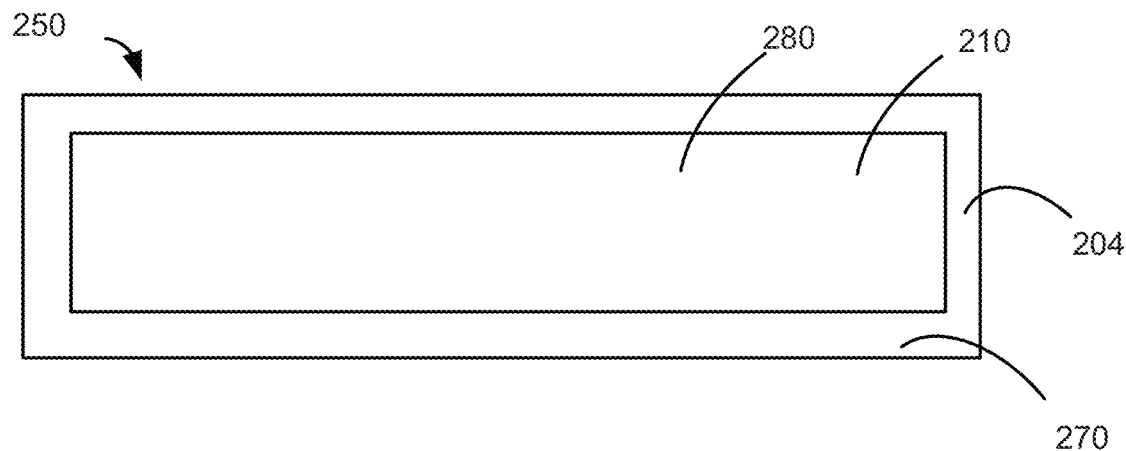
FIG. 6 is a converted lamellar particle according to another aspect of the disclosure.
Figure 7:
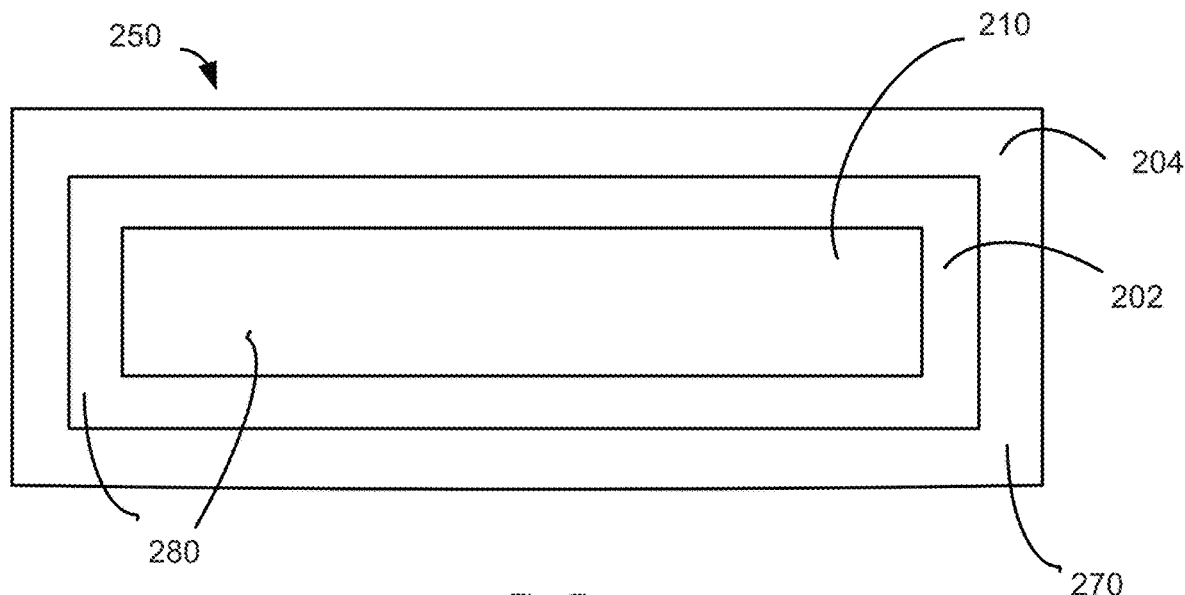
FIG. 7 is a converted lamellar particle according to another aspect of the disclosure.
Figure 8:
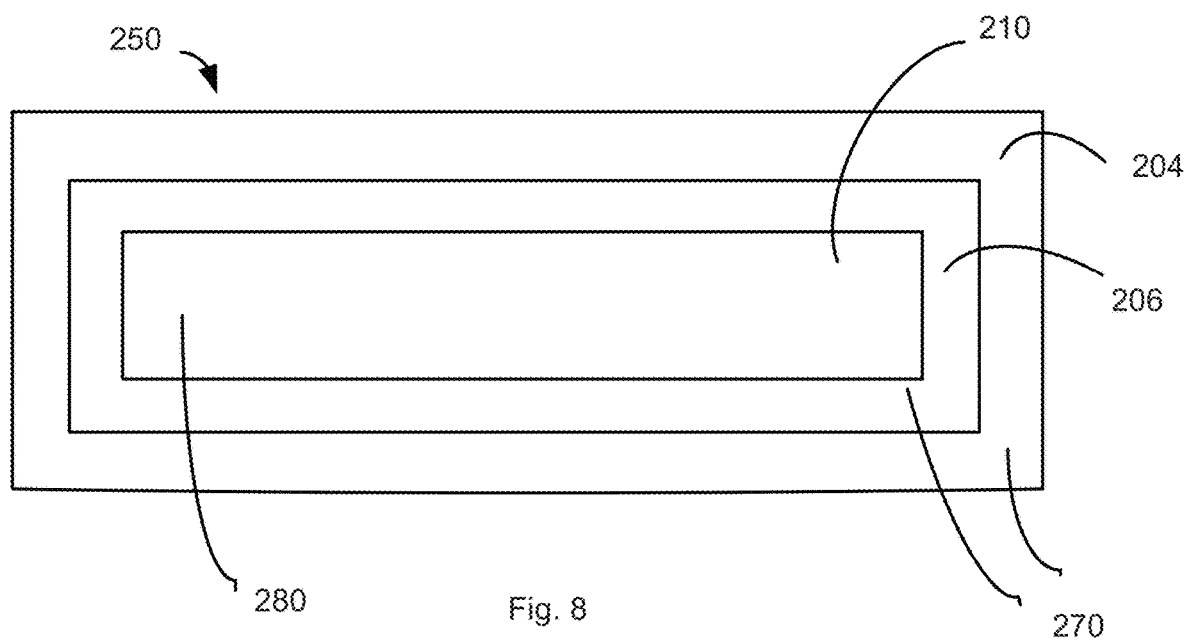
FIG. 8 is a converted lamellar particle according to another aspect of the disclosure.

Once subjected to a conversion process including, but not limited to, those described above, pre-conversion lamellar particle 200 can be converted to a converted lamellar particle, including, but not limited to, converted lamellar particle 250 of FIG. 6, 7, or 8. Converted lamellar particle 250 can include a converted portion 270 and an unconverted portion 280. The unconverted portion 280 can include a first metal and the converted portion 270 can include a chemical compound of the first metal. In some examples, about one percent to about 100 percent of unconverted external layer 202 can be converted to a converted external layer 204. In some examples, about zero percent to about 100 percent of unconverted inner core 210 can be converted to a converted inner core 206.

In the example illustrated in FIG. 6, 100 percent of the unconverted external layer 202 was converted to converted external layer 204 and zero percent of unconverted inner core 210 was converted. Thus, the converted portion of the lamellar particle 270 is the same as the converted external layer 204 and the unconverted portion of the lamellar particle 280 is the same as unconverted inner core 210

In the example illustrated in FIG. 7, less than 100 percent of the unconverted external layer 202 was converted to converted external layer 204 and zero percent of unconverted inner core 210 was converted. Thus, the converted portion of the lamellar particle 270 includes the converted external layer 204; and the unconverted portion of the lamellar particle 280 includes the unconverted external layer 202 and the unconverted inner core 210. In an aspect, with regard to FIG. 7, the unconverted external layer 202 can include a first metal and converted external layer 204 can include a chemical compound of the first metal.

In the example illustrated in FIG. 8, 100 percent of the unconverted external layer 202 was converted to converted external layer 204 and at least a portion of unconverted inner core 210 was converted to converted inner core 206. Thus, the converted portion of the lamellar particle 270 includes the converted external layer 204 and the converted inner core 206; and the unconverted portion of the lamellar particle 280 includes the unconverted inner core 210. In an aspect, with regard to FIG. 8, the unconverted inner core 210 can include a first metal and converted inner core 206 can include a chemical compound of the first metal.

Figure 9:
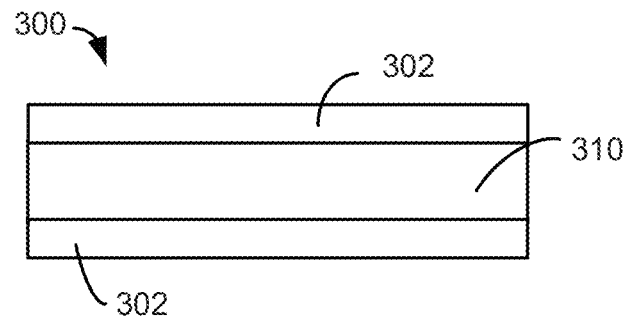
FIG. 9 is a pre-conversion lamellar particle according to another aspect of the disclosure.

In an additional example, as illustrated in FIG. 9, the pre-conversion lamellar particle 300 can include an unconverted inner core 310 sandwiched by unconverted external layers 302. For example, unconverted external layers 302 can be external to a first side of the unconverted inner core 310 and a second side of the unconverted inner core 310 opposite the first side, but not external to any of the other sides, i.e., the unconverted external layers 302 do not encapsulate the unconverted inner core 310. The unconverted inner core 310 can be made of a first material, and the unconverted external layers 302 can be made of a second material. In some examples, the first material is a first metal and the second material is a second metal. In some examples, the first material can include, but is not limited to, aluminum, copper, stainless steel, silver, gold, zinc, iron, bronzes, manganese, titanium, zirconium, vanadium, niobium, chromium, molybdenum, nickel, tungsten, tin, indium, bismuth, alloys of any of these metals or a combination thereof. The second material can include, but is not limited to (i) metals or metal alloys, such as one or more of aluminum, copper, stainless steel, silver, gold, zinc, iron, bronzes, manganese, titanium, zirconium, vanadium, niobium, chromium, molybdenum, nickel, tungsten, tin, indium, bismuth, alloys of any of these metals or a combination thereof, (ii) dielectrics, such as metal oxides, glasses, chalcogenides, halides, sulfides, minerals, synthetic micro and nano-crystals, organic and inorganic polymers, (iii) conductive materials, such as indium-tin oxide, tin oxide, metal doped oxides, and conductive polymers, and/or (iv) metalloids and non-metals, such as silicon, germanium, carbon, graphite, and graphene. The materials listed in (ii)-(iv) can partially and/or not completely converted when subjected to chemical conversion. The materials listed in (ii)-(iv) can provide various non-visual attributes or can act as conversion barrier. For example, the first material can be less reactive to a given conversion process, thus creating a location within the lamellar particle in which the conversion is likely to stop i.e., can function as a "conversion barrier." Further, in some examples, the lamellar particle can include a plurality of layers, such as an internal layer, and/or a plurality of materials.

Once subjected to a conversion process including, but not limited to, those described above, pre-conversion lamellar particle 300 can be converted to a converted lamellar particle including, but not limited to, converted lamellar particle 350 of FIGS. 10A-10B, 11A-B, or 12A-B. Converted lamellar particle 350 can include a converted portion 370 and an unconverted portion 380. The unconverted portion 380 can include a first metal and the converted portion 370 can include a chemical compound of the first metal. In some examples, about one percent to about 100 percent of unconverted external layers 302 can be converted to converted external layers 304. In some examples, zero percent to 100 percent of unconverted inner core 310 can be converted to converted inner core 306.

Figure 10A:
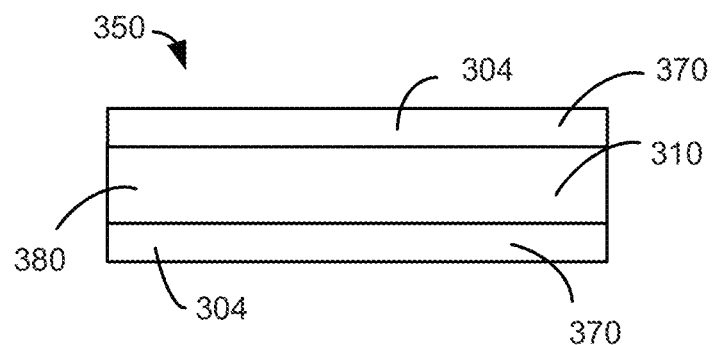
FIG. 10A is a converted lamellar particle according to another aspect of the disclosure.

In the example illustrated in FIG. 10A, 100 percent of the unconverted external layer 302 was converted to converted external layer 304 and zero percent of the unconverted inner core 310 was converted. Thus, the converted portion of the lamellar particle 370 is the same as converted external layer 304; and the unconverted portion of the lamellar particle 380 is the same as the unconverted inner core 310.

Figure 10B:
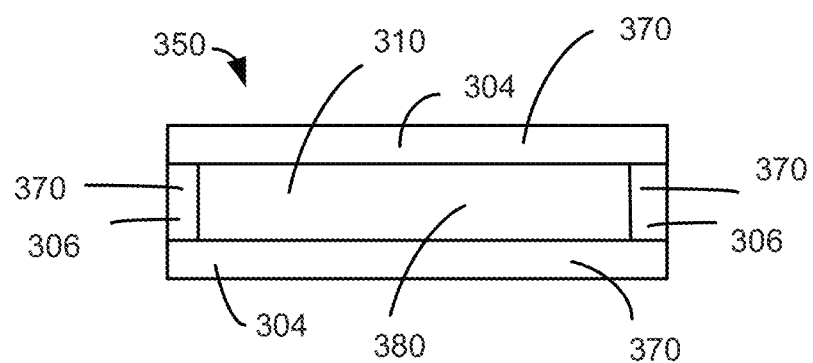
FIG. 10B is another converted lamellar particle according to another aspect of the disclosure.

In the example illustrated in FIG. 10B, 100 percent of the unconverted external layer 302 was converted to converted external layer 304 and a small percent (at least a part) of the unconverted inner core 310 was converted to converted inner core 306. In particular, the sides of the unconverted inner core 310 that did not have an unconverted external layer 302 external thereto were converted. Thus, the converted portion of the lamellar particle 370 includes the converted external layer 304 and at least a part, i.e., the sides of, the converted inner core 306; and the unconverted portion of the lamellar particle 380 is the same as the unconverted inner core 310. In an aspect, the unconverted inner core 310 can include a first metal and the converted inner core 306 can include a chemical compound of the first metal.

Figure 11A:
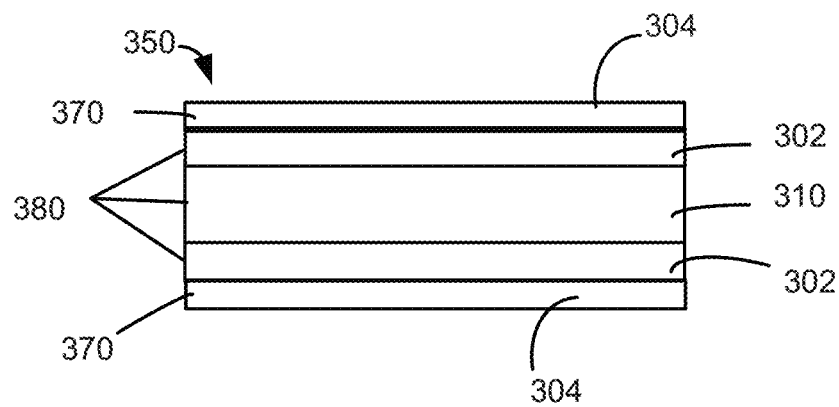
FIG. 11A is a converted lamellar particle according to another aspect of the disclosure.

In the example illustrated in FIG. 11A, less than 100 percent of the unconverted external layer 302 was converted to converted external layer 304 and zero percent of unconverted inner core 310 was converted. Thus, the converted portion of the lamellar particle 370 includes the converted external layer 304; and the unconverted portion of the lamellar particle 380 includes the unconverted external layers 302 and the unconverted inner core 310. In an aspect, the unconverted external layer 302 can include a first metal and the converted external layer 304 can include a chemical compound of the first metal.

Figure 11B:
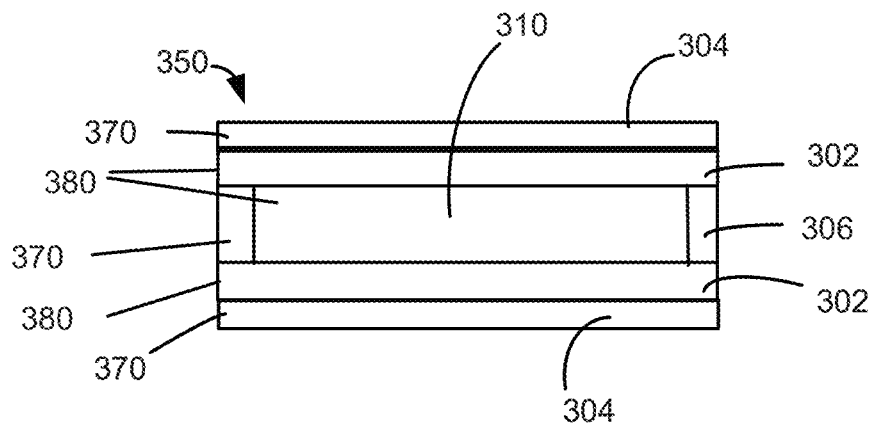
FIG. 11B is a converted lamellar particle according to another aspect of the disclosure.

In the example illustrated in FIG. 11B, less than 100 percent of the unconverted external layer 302 was converted to converted external layer 304 and a percentage (at least a part) of unconverted inner core 310 was converted to converted inner core 306. In particular, the sides of the unconverted inner core 310 that did not have an unconverted external layer 302 external thereto were converted. Thus, the converted portion of the lamellar particle 370 includes the converted external layer 304 and at least a part, i.e., the sides of the converted inner core 306; and the unconverted portion of the lamellar particle 380 includes the unconverted external layers 302 and the unconverted inner core 310. In an aspect, the unconverted inner core 310 can include a first metal and the converted inner core 306 can include a chemical compound of the first metal. In another aspect, the unconverted external layer 302 can include the first metal and the converted external layer 304 can include a chemical compound of the first metal.

Figure 12A:
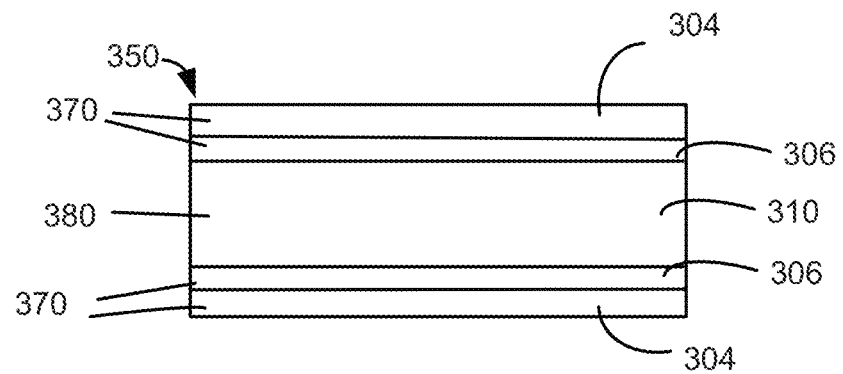
FIG. 12A is a converted lamellar particle according to another aspect of the disclosure.

In the example illustrated in FIG. 12A, 100 percent of the unconverted external layer 302 was converted to converted external layer 304 and at least a portion of the unconverted inner core 310 was converted to converted inner core 306. Thus, the converted portion of the lamellar particle 370 includes the converted external layers 304 and the converted inner core 306; and the unconverted portion of the lamellar particle 380 includes the unconverted inner core 310. In an aspect, the unconverted inner core 310 can include a first metal and the converted inner core 306 can include a chemical compound of the first metal.

Figure 12B:
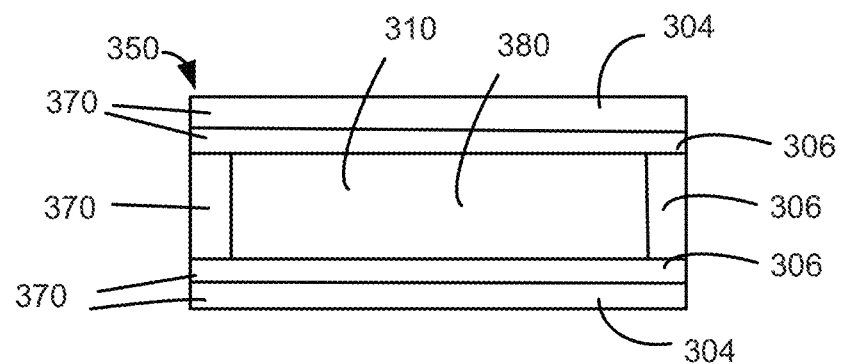
FIG. 12B is a converted lamellar particle according to another aspect of the disclosure.

In the example illustrated in FIG. 12B, 100 percent of the unconverted external layer 302 was converted to converted external layer 304 and a small percentage (i.e., at least a part) of the unconverted inner core 310 was converted to converted inner core 306. In particular, the sides of the unconverted inner core 310 that did not have an unconverted external layer 302 external thereto were converted. Thus, the converted portion of the lamellar particle 370 includes the converted external layers 304 and the converted inner core 306; and the unconverted portion of the lamellar particle 380 includes the unconverted inner core 310. In an aspect, the unconverted inner core 310 can include a first metal and the converted inner core 306 can include a chemical compound of the first metal.

Figure 13:
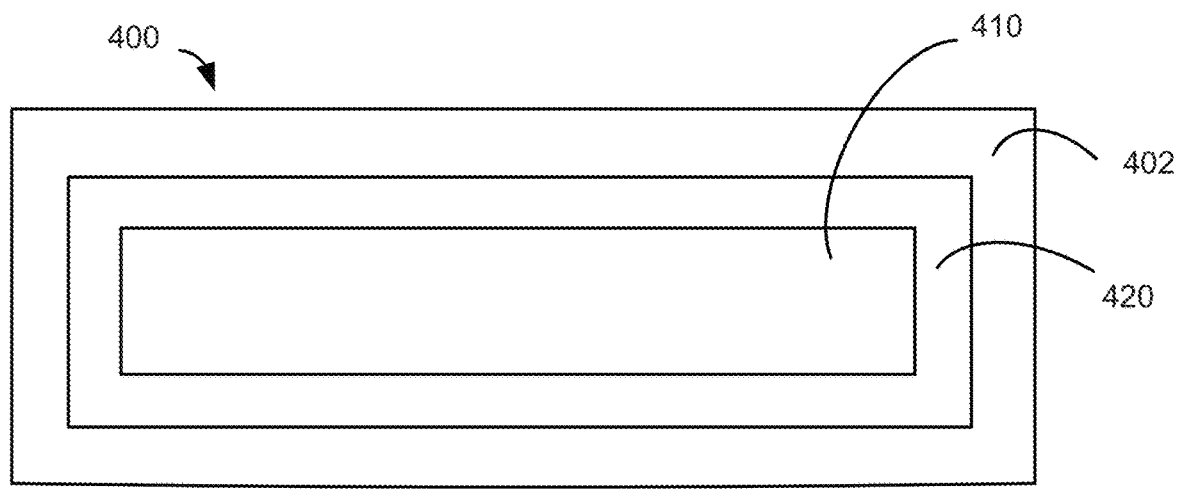
FIG. 13 is a pre-conversion lamellar particle according to another aspect of the disclosure.

In the example illustrated in FIG. 13, the pre-conversion lamellar particle 400 can include at least three layers. For example, the pre-conversion lamellar particle 400 can include an unconverted inner core 410, an internal layer 420, and/or an unconverted external layer 402. In some examples, pre-conversion lamellar particle 400 can include a first material in the unconverted external layer 402 encapsulating a second material in the unconverted inner core 410 with an internal layer 420 between the first and second materials. The internal layer 420 can be external of two sides (e.g., sandwiching unconverted inner core 410) to six sides (e.g., encapsulating unconverted inner core 410). In some examples, the first material can include, but is not limited to, aluminum, copper, stainless steel, silver, gold, zinc, iron, bronzes, manganese, titanium, zirconium, vanadium, niobium, chromium, molybdenum, nickel, tungsten, tin, indium, bismuth, alloys of any of these metals or a combination thereof. The second material can include, but is not limited to (i) metals or metal alloys, such as one or more of aluminum, copper, stainless steel, silver, gold, zinc, iron, bronzes, manganese, titanium, zirconium, vanadium, niobium, chromium, molybdenum, nickel, tungsten, tin, indium, bismuth, alloys of any of these metals or a combination thereof, (ii) dielectrics, such as metal oxides, glasses, chalcogenides, halides, sulfides, minerals, synthetic micro and nano-crystals, organic and inorganic polymers, (iii) conductive materials, such as indium-tin oxide, tin oxide, metal doped oxides, and conductive polymers, and/or (iv) metalloids and non-metals, such as silicon, germanium, carbon, graphite, and graphene. The internal layer 420 can include any material, including materials (ii)-(iv). The materials listed in (ii)-(iv) can be a less reactive to a chemical conversion process. Their function can be to provide other non-visual attributes or to act as conversion barrier. For example, the internal layer 420 can be less reactive to a given conversion process, thus creating a location with the lamellar particle in which the conversion is likely to stop, i.e., function as a "conversion barrier." Further, in some examples, the unconverted inner core 410, and/or the unconverted external layer 402 can include a plurality of layers and/or a plurality of materials.

Figure 14:
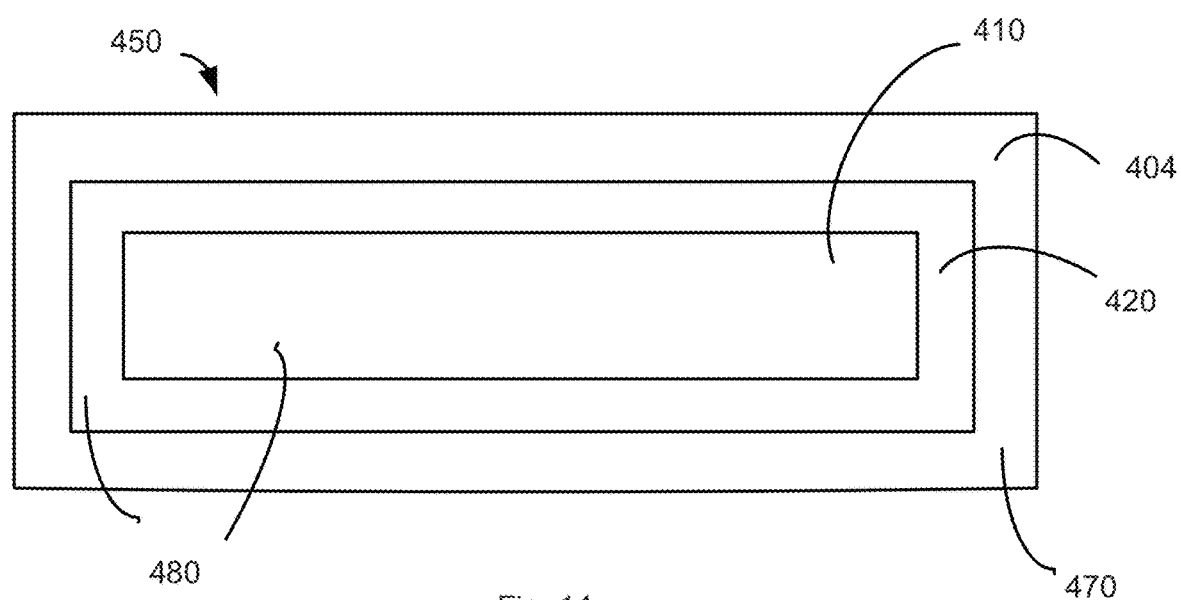
FIG. 14 is a converted lamellar particle according to another aspect of the disclosure.

Once subjected to a conversion process including, but not limited to those described above, pre-conversion lamellar particle 400 can be converted to a converted lamellar particle, including but not limited to converted lamellar particle 450 of FIG. 14. Converted lamellar particle 450 can include a converted portion 470 and an unconverted portion 480. The unconverted portion 480 can include a first metal and the converted portion 470 can include a chemical compound of the first metal. In some examples, about one percent to 100 percent of unconverted external layer 402 can be converted to converted external layer 404. In some examples, zero percent to 100 percent of unconverted inner core 410 can be converted to converted inner core 406. In some examples, zero percent to 100 percent of internal layer 420 can be converted.

In the example illustrated in FIG. 14, 100 percent of the unconverted external layer 402 was converted to converted external layer 404; and none of internal layer 420 and unconverted inner core 410 were converted. Thus, the converted portion of the lamellar particle 470 is the same as converted external layer 404; and the unconverted portion of the lamellar particle 480 is the internal layer 420 and the unconverted inner core 410. Similar to converted lamellar particles 150, 250, and 350, the definition of the converted portion of the lamellar particle 470 and unconverted portion of lamellar particle 480 depends on which layers were converted and to what extent. In an aspect, the unconverted inner core 410 can include a first metal, the internal layer 420 can include a material from those listed in (ii)-(iv) above, such as a dielectric or barrier layer, and the converted inner core can include a chemical compound of the first metal. In another aspect, the unconverted external layer can include a first metal and the converted external layer 404 can include a chemical compound of the first metal. Additionally, or alternatively, the unconverted inner core 410 can include a first metal, unconverted external layer 402 can include the first metal, and the converted external layer 404 can include a chemical compound of the first metal.

Figure 15:
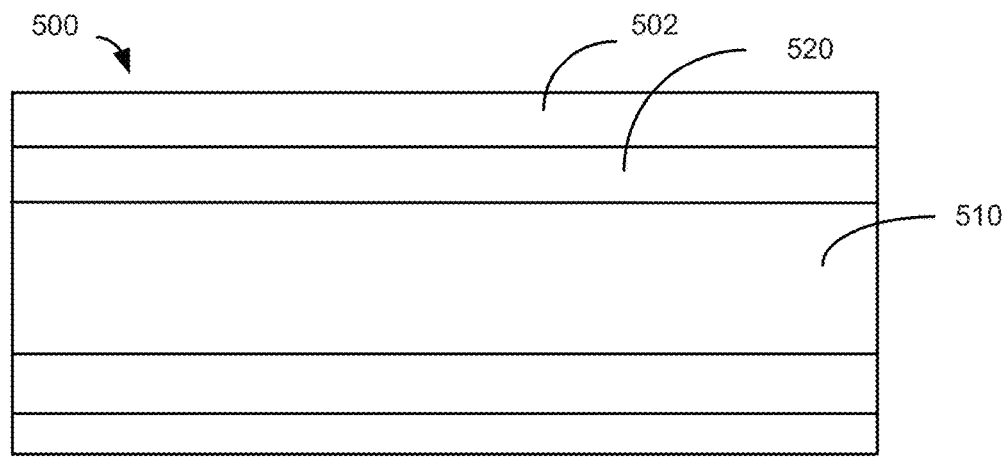
FIG. 15 is a pre-conversion lamellar particle according to another aspect of the disclosure.

In an additional example, as illustrated in FIG. 15, the pre-conversion lamellar particle 500 can include an unconverted inner core 510 sandwiched by the unconverted external layer 502, with an internal layer 520 between the unconverted inner core 520 and the unconverted external layer 502 on each side. For example, unconverted external layer 502 can be external to the internal layer 520 which can be in turn external to a first side and a second side opposite the first side of the unconverted inner core 510, but not external to any of the other sides (e.g., at least four sides of the unconverted inner core 510 are free of unconverted external layers 502 and/or barrier layers 520). The unconverted external layer 502 can be made of a second material and the unconverted inner core 510 can be made of a first material. At least the first material can be a metal. In some examples, the first material and the second material can include, but are not limited to, aluminum, copper, stainless steel, silver, gold, zinc, iron, bronzes, manganese, titanium, zirconium, vanadium, niobium, chromium, molybdenum, nickel, tungsten, tin, indium, bismuth, alloys of any of these metals or a combination thereof. The second material can include, but is not limited to (i) metals, such as one or more of aluminum, copper, stainless steel, silver, gold, zinc, iron, bronzes, manganese, titanium, zirconium, vanadium, niobium, chromium, molybdenum, nickel, tungsten, tin, indium, bismuth, alloys of any of these metals or a combination thereof. The internal layer 520 can include, but is not limited to (ii) dielectrics, such as metal oxides, glasses, chalcogenides, halides, sulfides, minerals, synthetic micro and nano-crystals, organic and inorganic polymers, (iii) conductive materials, such as indium-tin oxide, tin oxide, metal doped oxides, and conductive polymers, and/or (iv) metalloids and non-metals, such as silicon, germanium, carbon, graphite, and graphene. The materials listed in (ii)-(iv) can partially and/or not completely converted when subjected to chemical conversion. The function of the materials listed in (ii)-(iv) can provide various non-visual attributes, i.e., can act as conversion barrier. For example, the internal layer 520 can be less reactive to a given conversion process, thus creating a location within the lamellar particle 500 in which the conversion is likely to stop or a "conversion barrier." Further, in some examples, the unconverted inner core 510 and/or the unconverted external layer 502 can include a plurality of layers and/or a plurality of materials.

Figure 16A:
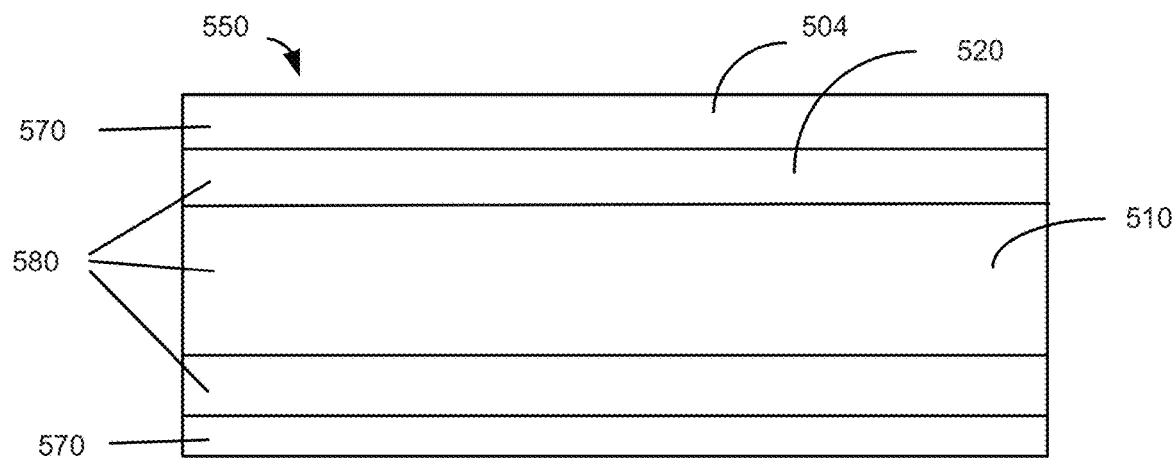
FIG. 16A is a converted lamellar particle according to another aspect of the disclosure.
Figure 16B:
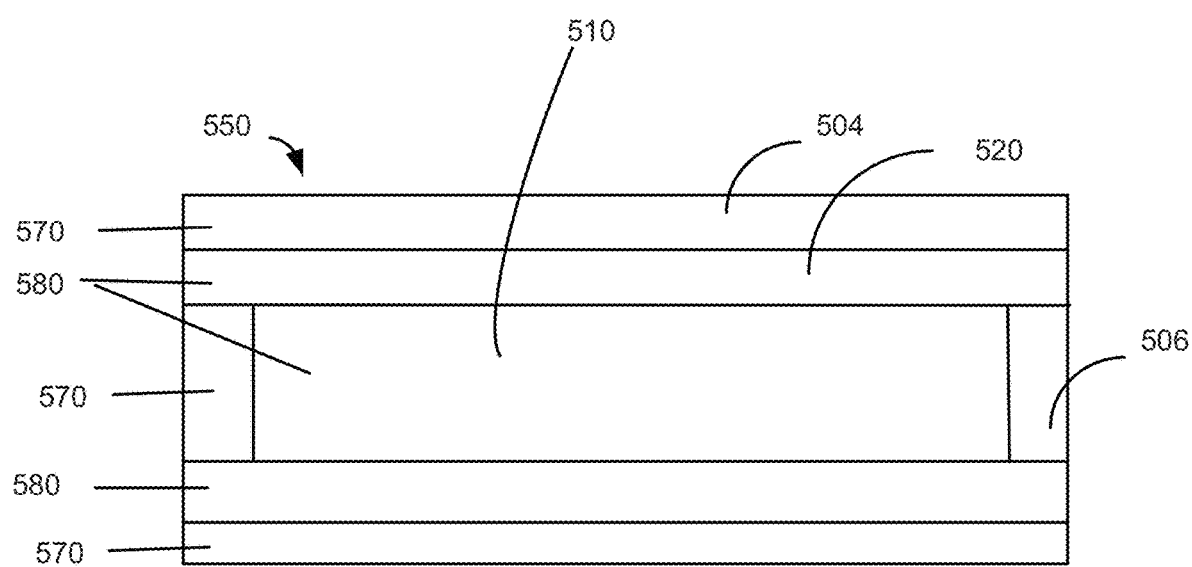
FIG. 16B is a converted lamellar particle according to another aspect of the disclosure.

Once subjected to a conversion process including, but not limited to those described above, pre-conversion lamellar particle 500 can be converted to a converted lamellar particle, including, but not limited, to converted lamellar particle 550 of FIGS. 16A-B. Converted lamellar particle 550 can include a converted portion 570 and an unconverted portion 580. The unconverted portion 580 can include a first metal and the converted portion 570 can include a chemical compound of the first metal. In some examples, about one percent to 100 percent of the unconverted external layers 502 can be converted to converted external layers 504. In some examples, zero percent to 100 percent of unconverted inner core 510 can be converted to converted inner core 506. In some examples, zero percent to 100 percent of internal layers 520 can be converted.

In the example illustrated in FIG. 16A, some or all of the unconverted external layer 502 was converted to the converted external layer 504; and none of the internal layers 520 and the unconverted inner core 510 were converted. Thus, the converted portion of the lamellar particle 570 includes the converted external layer 504; and the unconverted portion of the lamellar particle 580 can include internal layers 520 and the unconverted inner core 510. In some examples, the unconverted portion 580 can also include an unconverted external layer 502 (not shown in the Figures). Similar to converted lamellar particles 150, 250, 350, and 450, the definition of the converted portion of the lamellar particle 570 and unconverted portion of lamellar particle 580 depends on which layers were converted and to what extent.

In an aspect, the unconverted inner core 510 can include a first metal, the internal layer 520 can include a material from those listed in (ii)-(iv) above, such as a dielectric or barrier layer, and the converted inner core can include a chemical compound of the first metal. In another aspect, the unconverted external layer can include a first metal, the internal layer 520 can include a material from those listed in (ii)-(iv) above, such as a dielectric or barrier layer, and the converted external layer 504 can include a chemical compound of the first metal. Additionally, or alternatively, the unconverted inner core 510 can include a first metal, unconverted external layer 502 can include the first metal, and the converted external layer 504 can include a chemical compound of the first metal.

In the example illustrated in FIG. 16B, some or all of the unconverted external layer 502 was converted to the converted external layer 504; and none of the internal layers 520 and the unconverted inner core 510 were converted. Thus, the converted portion of the lamellar particle 570 includes the converted external layer 504; and the unconverted portion of the lamellar particle 580 can include internal layers 520 and the unconverted inner core 510. In some examples, the unconverted portion 580 can also include an unconverted external layer 502 (not shown in the Figures). Similar to converted lamellar particles 150, 250, 350, and 450, the definition of the converted portion of the lamellar particle 570 and unconverted portion of lamellar particle 580 depends on which layers were converted and to what extent. In an aspect, the unconverted inner core 510 can include a first metal and the converted inner core 506 can include a chemical compound of the first metal. In another aspect, the unconverted external layer can include a first metal, the internal layer 520 can include a material from those listed in (ii)-(iv) above, such as a dielectric or barrier layer, and the converted external layer 504 can include a chemical compound of the first metal. Additionally, or alternatively, the unconverted inner core 510 can include a first metal, unconverted external layer 502 can include the first metal, and the converted external layer 504 can include a chemical compound of the first metal.

A pigment comprising a plurality of the lamellar particles that include at least two of the following properties: magnetic, EMI attenuating, electrically conductive, and heat conductive.

A method, comprising: chemically converting a first material of a lamellar particle into a compound of the first material. The method wherein the first material is metal. The method, wherein prior to the chemical conversion, the lamellar has an aspect ratio at least 2:1. The method, wherein the first material is external to or surrounds a second material. The method, wherein the compound of the first material comprises a sulfide, phosphate, chromate, molybdate, permanganate, vanadate, sulfate, carbonate, oxides, hydroxides, nitrates, tungstanates, titanates, fluorotitanates, and a combination thereof. The method, wherein the chemical conversion is performed by a reactant and the reactant is in a form of at least one of solid state, liquid state, vapor state, and plasma state. The method, wherein the liquid state is a chemical bath. The method, wherein the solid state is a tumbling bed of pre-flakes. The method, wherein the vapor state is a fluidized bed. The method, wherein the reactant is introduced in the form of ionized gas or is introduced into a plasma ignited in a carrier gas such as noble gases, oxygen, nitrogen, CO2, or introducing oxidation through heat. The method, wherein the chemical bath comprises water and a solvent. The method, wherein the chemical bath comprises at least one of an inorganic compound and an organic compound. The method, wherein the inorganic compound comprises at least one of sulfur, sulfides, sulfates, oxides, hydroxides, isocyanates, thiocyanates, molybdates, chromates, permanganates, carbonates, thiosulfates, and inorganic salts.

The method, wherein the organic compound comprises at least one of organic compound containing sulfur, nitrogen, oxygen and combinations thereof. The method, wherein the organic compound comprises at least one of thiols, amines, thioamines, oxythio amines, thiourea, isocyanates, thiocyanates, and silanes. The method, wherein the chemical bath comprises at least one of inorganic and organic salts of metals or metalorganic compounds of metals. The method, wherein the chemical bath comprises an oxidizing agent. The method, wherein the chemical bath comprises at least one of a surface modifier and inhibitors. The method, wherein the lamellar particle comprises a first material and a second material at least partially encapsulating the first material. The method, wherein the second material and the first material are different. The method, wherein the second material is deposited on the first material by at least one of metal plating processes, roll-to-roll metallization processes, chemical bath deposition, physical vapor deposition, and chemical vapor deposition. The method, further comprises depositing an internal layer between at least a portion of the second material and the first material. The method, wherein the internal layer is deposited by one of sol-gel, chemical bath deposition, plating, physical vapor deposition, and chemical vapor deposition.

A lamellar particle comprising a first portion including a first material, and a second portion external to the first portion, wherein the second portion includes a chemical compound of the first material.

Example 1

Figure 17:
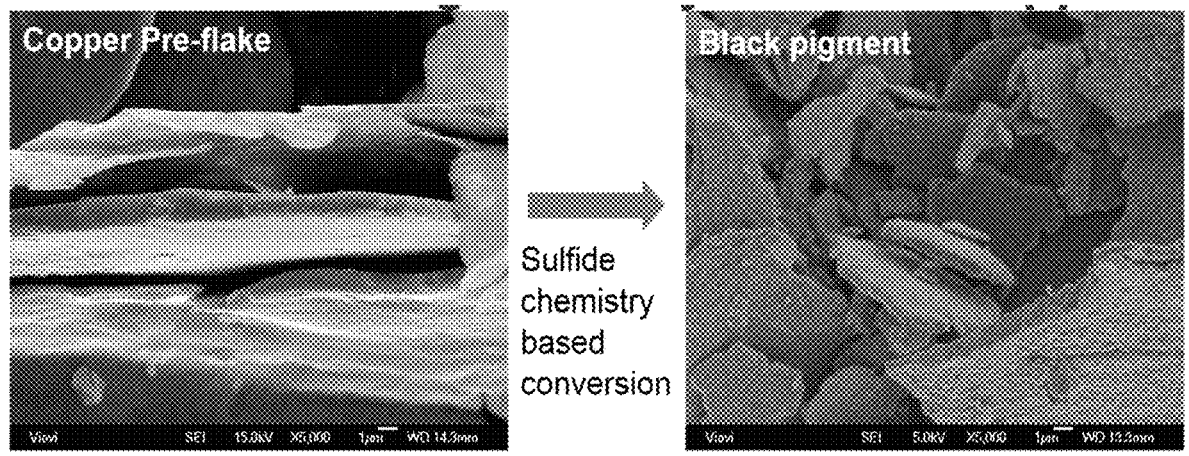
FIG. 17 is a photograph of a pre-conversion lamellar particle and a converted lamellar particle according to aspects of the disclosure.
Figure 18:
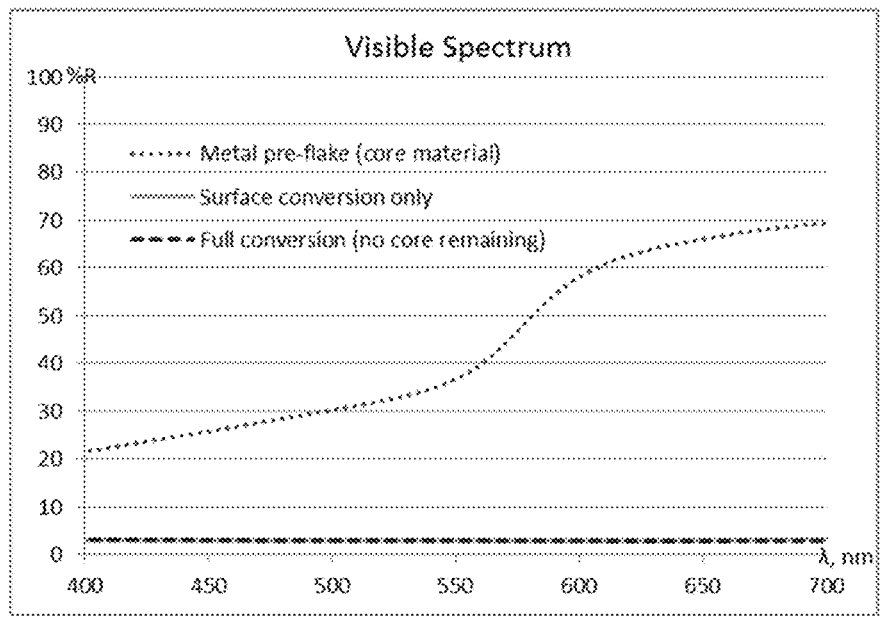
FIG. 18 is a graph of the visible spectrum of lamellar particles according to various aspects of the disclosure.
Figure 19:
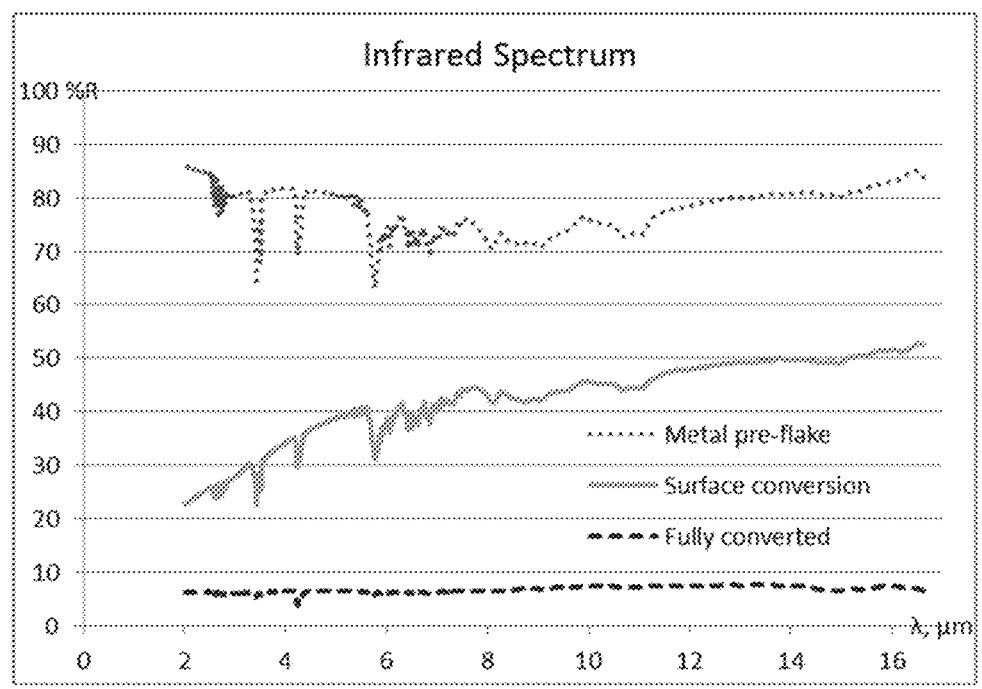
FIG. 19 is a graph of the infrared spectrum of lamellar particles according to various aspects of the disclosure.

Pre-conversion lamellar particles were purchased from Crescent Bronze (Oshkosh, Wis.) as a commercial product called Brilliant Copper 104. These pre-conversion lamellar particles were made solely of copper. The copper pre-conversion lamellar particles had a width of about 12 microns and a physical thickness of about 0.2 to 0.6 microns. Five grams of the copper pre-conversion lamellar particles were introduced into a 250 ml chemical bath having a temperature of approximately 50° C. for approximately 60 minutes. The chemical bath included $(NH_4)_2CO_3/K_2S$ in a 2:5 ratio +1% MBT (2-Mercaptobenzothaizole), CAS#140-30-4, from Sigma-Aldrich) 8% total solids concentration was present. The treated copper particles (e.g., converted lamellar particles) were then removed from the chemical bath and analyzed. The converted lamellar particles appeared black in color and had a reflectance in a visible range of less than 5 percent and an L*a*b* color space (L*) value of less than 24. In particular, this sample had an L* less than 20 and reflectance of less than 4 percent. A photograph of the copper pre-conversion lamellar particles and the converted pre-conversion lamellar particles is shown in FIG. 17. The analysis of the pre-conversion lamellar particles, surface conversion (partially treated particles), and the full conversion (fully treated particles) is shown in Table 1 below and in the graphs shown in FIGS. 18 and 19.

TABLE 1

| | | | |
|---|---|---|---|
| Metal pre-flake | maximum % R 69.4 @ 700 nm | color: metal | L* 70.5 |
| Surface conversion | maximum % R 3.3 @ 700 nm | color: black | L* 19.9 |
| Full conversion | maximum % R 3.2 @ 400 nm | color: black | L* 19.9 |

Example 2

Silver pre-conversion lamellar particles were purchased from AMES Goldsmith, South Glen Falls, N.Y. 12803. The silver pre-conversion lamellar particles product form AMES Goldsmith was an electronic grade product MB-499. It had a width of about 10 microns and thickness ranging from about 0.1-0.6 microns. Three sets of 1 gram silver pre-conversion lamellar particles were introduced into three sets of 100 ml chemical bath at room temperature for approximately 7 min, 30 min., and 45 min. respectively. Each of the chemical baths included $(NH_4)_2CO_3/K_2S$ in a 2:5 ratio +1% MBT (2-Mercaptobenzothiazole). 3.5% total solids concentration was present. The converted silver lamellar particles were then removed from the chemical bath and were analyzed. Each set of converted silver lamellar particles appeared as a different color. The reflection values at different wavelengths in visible range were color dependent at L*>35.

Figure 20:
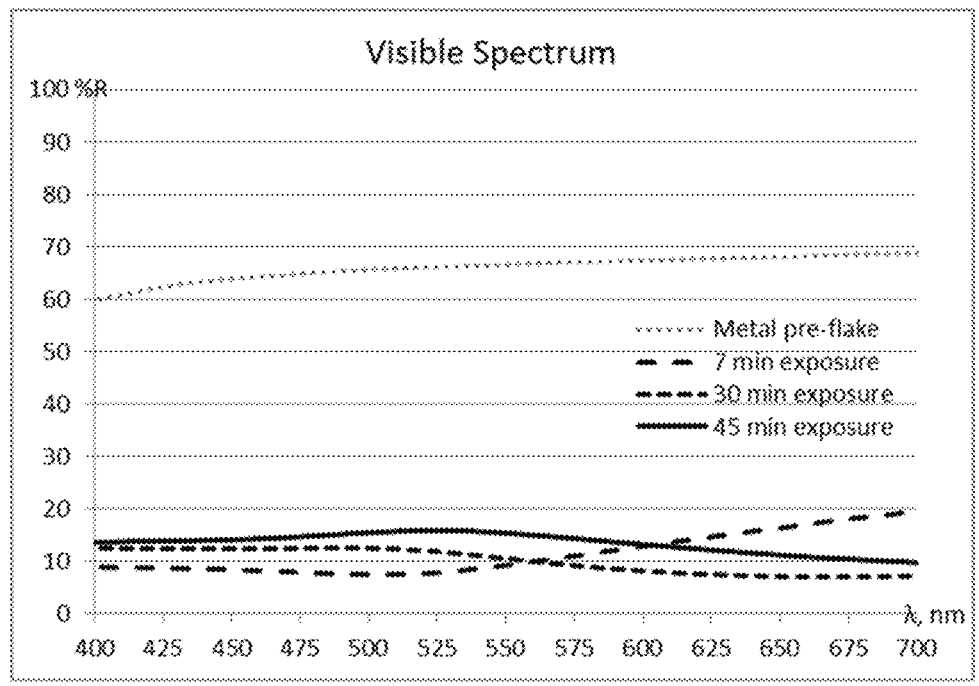
FIG. 20 is a graph of the visible spectrum of lamellar particles according to various aspects of the disclosure.
Figure 21:
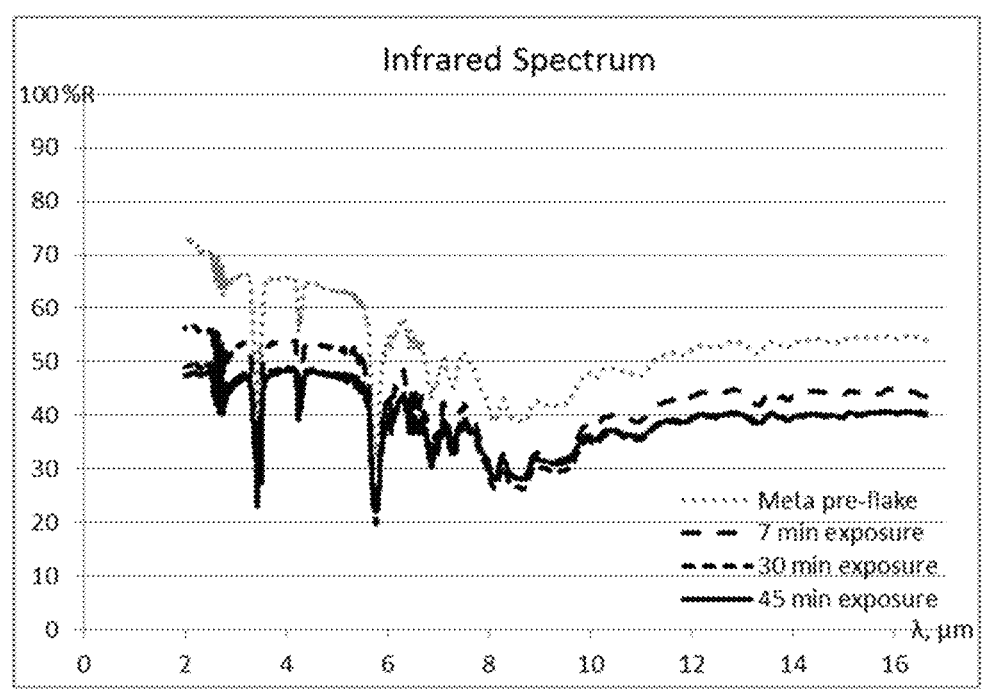
FIG. 21 is a graph of the infrared spectrum of lamellar particles according to various aspects of the disclosure.

The analysis of the three sets of converted silver lamellar particles is shown in Table 2 below and in the graphs shown in FIGS. 20 and 21.

TABLE 2

| | | | | |
|---|---|---|---|---|
| Metal pre-flake | color: metal | Maximum % R 68.7 @ 700 nm | Minimum % R 59.8 @ 400 nm | L* 85.3 |
| 7 min exposure | color: (brown) red | Maximum % R 19.5 @ 700 nm | Minimum % R 7.5 @ 504 nm | L* 37.9 |
| 30 min exposure | color: blue green | Maximum % R 12.6 @ 491 nm | Minimum % R 7.1 @ 666 nm | L* 38.5 |
| 45 min exposure | color: light green | Maximum % R 15.9 @ 526 nm | Minimum % R 9.8 @ 700 nm | L* 45.2 |

While principles of the present disclosure are described herein with reference to illustrative embodiments for particular applications, it should be understood that the disclosure is not limited thereto. Those having ordinary skill in the art and access to the teachings provided herein will recognize additional modifications, applications, embodiments, and substitution of equivalents all fall within the scope of the embodiments described herein. Accordingly, the disclosure is not to be considered as limited by the foregoing description.

We claim:

1. A lamellar particle, comprising:
an inner core of a first material; and
an external layer of a second material that is different from the first material;
an unconverted portion of the lamellar particle, wherein the unconverted portion includes an unconverted inner core and any unconverted external layer;
a converted portion of the lamellar particle disposed external to a surface of the unconverted portion, wherein the converted portion includes a chemical compound of the first material and the second material, wherein the converted portion includes any converted inner core and a converted external layer, and wherein the converted portion has a property different from a property of the unconverted portion.

2. The lamellar particle of claim 1, wherein the unconverted portion provides a light reflectance in a spectral region ranging from 0.4 to 20 microns and the converted portion absorbs light in a selected region of the spectral range.

3. The lamellar particle of claim 2, wherein selected region is in the visible range.

4. The lamellar particle of claim 1, wherein the converted portion absorbs light in a region capable of being viewed by the human eye.

5. The lamellar particle of claim 1, wherein the unconverted portion provides infrared reflectance and the converted portion modulates light in the visible range to create a desired color.

6. The lamellar particle of claim 5, wherein the desired color is one of red, black, or white.

7. The lamellar particle of claim 1, wherein the lamellar particle has an aspect ratio ranging of approximately 5:1 or higher.

8. The lamellar particle of claim 1, wherein the unconverted portion includes a plurality of layers.

9. The lamellar particle of claim 8, wherein the plurality of layers includes at least two different metals.

10. The lamellar particle of claim 9, wherein each layer of the plurality of layers is made of a different metal than each other layer of the plurality of layers.

11. The lamellar particle of claim 1, wherein the converted portion is chemically converted into a color chemical compound.

12. The lamellar particle of claim 1, wherein the unconverted portion includes a plurality of layers each of a different metal and the converted portion is separated from the plurality of layers by a dielectric material.

13. The lamellar particle of claim 1, wherein the converted portion provides at least one non-optical function.

14. The lamellar particle of claim 13, wherein the at least one non-optical function includes at least one of metal chemical passivation, encapsulation, moisture protection, and improving interactions with various paint, varnish, ink, and other host materials.

15. The lamellar particle of claim 13, wherein the converted portion offers a plurality of functions improving durability and reliability of the lamellar particle as a manufactured product or when dispersed in the paint, ink, varnish or other medium/carrier of choice or when applied in a final coating of dry and cured film of paint, ink, varnish, polymer or other medium.

16. A metallic effect pigment comprising a plurality of the lamellar particles of claim 1.

17. A magnetic pigment comprising a plurality of the lamellar particles of claim 1.

18. An EMI attenuating pigment comprising a plurality of the lamellar particles of claim 1.

19. An electrically conductive pigment comprising a plurality of claim 1.

20. A heat conducting pigment comprising a plurality of claim 1.

\* \* \* \* \*